United States Patent
Yu et al.

(10) Patent No.: US 12,267,048 B1
(45) Date of Patent: Apr. 1, 2025

(54) COMMON-EMITTER AMPLIFIER WITH UNILATERAL PRE-EMBEDDING INDUCTORS

(71) Applicant: Beijing University of Posts and Telecommunications, Beijing (CN)

(72) Inventors: Jianguo Yu, Beijing (CN); Xiaorui Liu, Beijing (CN); Yun Wang, Beijing (CN); Kaile Li, Beijing (CN); Yibo Huang, Beijing (CN); Feixiang Zhang, Beijing (CN); Zhihe Wu, Beijing (CN)

(73) Assignee: Beijing University of Posts and Telecommunications, Beijing (CN)

( * ) Notice: Subject to any disclaimer, the term of this patent is extended or adjusted under 35 U.S.C. 154(b) by 0 days.

(21) Appl. No.: 18/973,167

(22) Filed: Dec. 9, 2024

(30) Foreign Application Priority Data

Feb. 7, 2024 (CN) .......................... 202410173832.7

(51) Int. Cl.
*H03F 1/18* (2006.01)
*H03F 1/02* (2006.01)
*H03F 1/42* (2006.01)
*H03F 1/56* (2006.01)

(52) U.S. Cl.
CPC .............. *H03F 1/42* (2013.01); *H03F 1/0205* (2013.01); *H03F 1/565* (2013.01); *H03F 2200/255* (2013.01); *H03F 2200/451* (2013.01)

(58) Field of Classification Search
CPC ....................................................... H03F 1/18
USPC ..................................................... 330/54, 286
See application file for complete search history.

(56) References Cited

PUBLICATIONS

Beijing University of Posts and Telecommunications 9Applicant), Replacement claims (allowed) of CN202410173832.7, Aug. 12, 2024.
CNIPA, Notification to grant patent right for invention in CN202410173832.7, Aug. 19, 2024.

*Primary Examiner* — Henry Choe
(74) *Attorney, Agent, or Firm* — Hemisphere Law, PLLC; Zhigang Ma

(57) ABSTRACT

A common-emitter amplifier with unilateral pre-embedding inductors includes: an input matching circuit, a first-stage amplification circuit, a first-stage interstage matching circuit, a second-stage amplification circuit, a second-stage interstage matching circuit, a third-stage amplification circuit, and an output matching circuit. The common-emitter amplifier is configured to: make an input signal sequentially enter bases of common-emitter transistors of the first-stage, second-stage, and third-stage amplification circuits, make the input signal be amplified stage by stage by the common-emitter transistors, and finally make an amplified input signal obtained by amplifying of each common-emitter transistor output through a collector of each common-emitter transistor. The common-emitter amplifier is configured to introduce interstage staggered tuning to expand bandwidth to address a narrowband problem. The unilateral pre-embedding inductors are configured to reduce a required value of the parallel embedding inductor to reduce difficulty of implementing the parallel embedding inductor, conducive to the realization of transmission lines.

3 Claims, 4 Drawing Sheets

COMMON-EMITTER AMPLIFIER WITH UNILATERAL PRE-EMBEDDING INDUCTORS

CROSS-REFERENCE TO RELATED APPLICATION

This application claims priority to Chinese Patent Application No. 202410173832.7, filed on Feb. 7, 2024, which is herein incorporated by reference in its entirety.

TECHNICAL FIELD

The disclosure relates to the field of radio frequency integrated circuits, and more particularly to a common-emitter amplifier with unilateral pre-embedding inductors.

BACKGROUND

In 2023, the radio communication sector of the International Telecommunication Union (ITU-R) completed the IMT-2030 global 6-generation (6G) vision framework recommendation. Terahertz wireless communication needs to meet the requirements of new application scenarios such as ubiquitous connectivity, integrated communication and sensing, and artificial intelligence. However, as the operating frequency of a terahertz communication system gets closer to the maximum oscillation frequency ($f_{max}$) of a transistor, an inherent gain of an active device rapidly decreases, resulting in the poor power amplification capability of a silicon-based terahertz amplifier without any gain enhancement technology, which cannot meet system requirements.

In a common-emitter structure in the related art, by adopting parallel embedding networks and series embedding networks, i.e., Y/Z-embedding networks, a maximum available gain of an active double port network can be increased to a maximum achievable gain, as applied in non-patent literature "A high-gain mm-wave amplifier design: An analytical approach to power gain boosting." (Bameri H, Momeni O, IEEE Journal of Solid-State Circuits, 2017, 52(2): 357-370).

In practical implementation, if inductance values required for realizing the Y/Z-embedding network are too large, it is often necessary to perform pre-embedding at both ends of the transistor first to reduce the difficulty of implementing the Y/Z-embedding network. However, the above literature does not provide a complete set of pre-embedding theoretical formulas. Meanwhile, since the common-emitter amplifier structure with the Y/Z-embedding network relies on a resonance process of inductors and capacitors, the gain of the amplifier is only enhanced in a very small frequency band, resulting in lower bandwidth of the amplifier.

SUMMARY

In response to the above problems, the disclosure provides a common-emitter amplifier with unilateral pre-embedding inductors. By introducing a unilateral pre-embedding inductor into a collector, the required value of a parallel embedding inductor is reduced, which is more conducive to the realization of a transmission line, and the common-emitter amplifier has an advantage of high gain; at the same time, by performing staggered tuning between stages to expand bandwidth, the common-emitter amplifier has an advantage of wideband.

The common-emitter amplifier with the unilateral pre-embedding inductors includes: an input matching circuit, a first-stage amplification circuit, a first-stage interstage matching circuit, a second-stage amplification circuit, a second-stage interstage matching circuit, a third-stage amplification circuit, a third-stage interstage matching circuit, and an output matching circuit.

An input end of the input matching circuit is an input end configured to receive signals, an output end of the input matching circuit is connected to an input end of the first-stage amplification circuit, and the input matching circuit is configured to output a radio frequency (RF) signal to the first-stage amplification circuit for first-stage amplification thereby obtaining a first-stage amplified RF signal;

the first-stage interstage matching circuit is configured to transmit the first-stage amplified RF signal to the second-stage amplification circuit for two-stage amplification to obtain a two-stage amplified RF signal, an output end of the second-stage amplification circuit is connected to the second-stage interstage matching circuit;

the second-stage interstage matching circuit is configured to output the two-stage amplified RF signal amplified by the second-stage amplification circuit to the third-stage amplification circuit, and the third-stage amplification circuit performs further amplification to obtain a three-stage amplified RF signal;

an output end of the third-stage amplification circuit is connected to the output matching circuit, and the output matching circuit is configured to output the three-stage amplified RF signal to an output end of the common-emitter amplifier.

The input matching circuit includes a first transmission line, a second transmission line, and a first direct current (DC)-blocking capacitor.

The first end of the first transmission line is connected to the input end, the second end of the first transmission line is connected to the first end of the second transmission line and the first end of the first DC-blocking capacitor individually, the second end of the second transmission line is grounded, and the second end of the first DC-blocking capacitor is connected to the first-stage amplification circuit.

The first-stage amplification circuit includes: a first common-emitter transistor, a first unilateral pre-embedding inductor, a first parallel embedding inductor, a first capacitor, a first RF choke inductor, and a second RF choke inductor.

A base of the first common-emitter transistor is connected to the second end of the first DC-blocking capacitor, the first end of the first RF choke inductor, and the first end of the first capacitor individually, an emitter of the first common-emitter transistor is grounded, and a collector of the first common-emitter transistor is connected to the first end of the first unilateral pre-embedding inductor.

The second end of the first RF choke inductor is connected to a base bias voltage, the second end of the first capacitor is connected to the first end of the first parallel embedding inductor, the second end of the first parallel embedding inductor is connected to the second end of the first unilateral pre-embedding inductor, the second end of the first unilateral pre-embedding inductor is connected to the first end of the second RF choke inductor, and the second end of the second RF choke inductor is connected to a power supply voltage.

The first-stage interstage matching circuit includes: a third transmission line, a fourth transmission line, a second DC-blocking capacitor, and a third DC-blocking capacitor.

The first end of the second DC-blocking capacitor is connected to the second end of the first unilateral pre-embedding inductor, the second end of the second DC-blocking capacitor is connected to the first end of the third transmission line, the second end of the third transmission line is connected to the first end of the fourth transmission line, the second end of the fourth transmission line is grounded, and the second end of the third transmission line is connected to the first end of the third DC-blocking capacitor.

The second-stage amplification circuit includes: a second common-emitter transistor, a second unilateral pre-embedding inductor, a second parallel embedding inductor, a second capacitor, a third RF choke inductor, and a fourth RF choke inductor.

A base of the second common-emitter transistor is connected to the second end of the third DC-blocking capacitor, the first end of the third RF choke inductor, and the first end of the second capacitor individually, an emitter of the second common-emitter transistor is grounded, and a collector of the second common-emitter transistor is connected to the first end of the second unilateral pre-embedding inductor.

The second end of the third RF choke inductor is connected to the base bias voltage, the second end of the second capacitor is connected to the first end of the second parallel embedding inductor, the second end of the second parallel embedding inductor is connected to the second end of the second unilateral pre-embedding inductor, the second end of the second unilateral pre-embedding inductor is connected to the first end of the fourth RF choke inductor, and the second end of the fourth RF choke inductor is connected to the power supply voltage.

The second-stage interstage matching circuit includes: a fifth transmission line, a sixth transmission line, a fourth DC-blocking capacitor, and a fifth DC-blocking capacitor.

The first end of the fourth DC-blocking capacitor is connected to the second end of the second unilateral pre-embedding inductor, the second end of the fourth DC-blocking capacitor is connected to the first end of the fifth transmission line, the second end of the fifth transmission line is connected to the first end of the sixth transmission line, the second end of the sixth transmission line is grounded, and the second end of the fifth transmission line is connected to the first end of the fifth DC-blocking capacitor.

The third-stage amplification circuit includes: a third common-emitter transistor), a third unilateral pre-embedding inductor, a third parallel embedding inductor, a third capacitor, a fifth RF choke inductor, and a sixth RF choke inductor.

A base of the third common-emitter transistor is connected to the second end of the fifth DC-blocking capacitor, the first end of the fifth RF choke inductor, and the first end of the third capacitor individually, an emitter of the third common-emitter transistor is grounded, and a collector of the third common-emitter transistor is connected to the first end of the third unilateral pre-embedding inductor.

The second end of the fifth RF choke inductor is connected to the base bias voltage, the second end of the third capacitor is connected to the first end of the third parallel embedding inductor, the second end of the third parallel embedding inductor is connected to the second end of the third unilateral pre-embedding inductor, the second end of the third unilateral pre-embedding inductor is connected to the first end of the sixth RF choke inductor, and the second end of the sixth RF choke inductor is connected to the power supply voltage.

The output matching circuit includes: a seventh transmission line, an eighth transmission line, and a sixth DC-blocking capacitor.

The first end of the sixth DC-blocking capacitor is connected to the second end of the third unilateral pre-embedding inductor, the second end of the sixth DC-blocking capacitor is connected to the first end of the seventh transmission line, the second end of the seventh transmission line is connected to the first end of the eighth transmission line, the second end of the eighth transmission line is grounded, and the second end of the seventh transmission line is connected to the output end of the common-emitter amplifier.

A working principle of the common-emitter amplifier with a single-sided pre-embedding inductor is as follows.

1. The common-emitter amplifier is configured to: make an input signal sequentially enter the bases of the common-emitter transistors of the first-stage, second-stage, and third-stage amplification circuits, make the input signal be amplified stage by stage by the common-emitter transistors, and finally make an amplified input signal obtained by amplifying of each common-emitter transistor output through the collector of each of the common-emitter transistors, as an output signal of each common-emitter transistor; and the common-emitter amplifier is further configured to introduce interstage staggered tuning to expand bandwidth to address a narrowband problem caused by the resonance of inductance and capacitance.

2. A miller capacitor between the base and the collector of each common-emitter transistor causes direct coupling between originally isolated input and output signals of each common-emitter transistor, and an amplitude of the output signal of the collector of each common-emitter transistor is closely related to a value of the miller capacitor.

Meanwhile, a parallel embedding inductor is introduced between the base and the collector of each common-emitter transistor, and is configured to resonate with the miller capacitor between the base and the collector of each common-emitter transistor thereby eliminating the influence of the miller capacitor, improving the amplitude of the output signal of the collector of each of the common-emitter transistors, and increase a gain $G_{ma}$ of each common-emitter transistor to a maximum achievable gain $G_{max}$ at an operating frequency.

3. The common-emitter amplifier further includes the unilateral pre-embedding inductors, and each unilateral pre-embedding inductor is configured to reduce a required value of the parallel embedding inductor between the base and the collector of a corresponding common-emitter transistor, thereby reducing a difficulty of implementing the parallel embedding inductor between the base and the collector of the corresponding common-emitter transistor at high frequencies.

A specific process is as follows.

Firstly, an admittance matrix of the first common-emitter transistor of the common-emitter transistors is expressed as $[Y_{11}\ Y_{12};\ Y_{21}\ Y_{22}]$, an impedance of the first unilateral pre-embedding inductor of the unilateral pre-embedding inductors is expressed as $jX_c$, an admittance value of a parallel embedding network including the parallel embedding inductor and the first capacitor is expressed as $jB_p$, and an admittance matrix ($Y_{tot}$) of a total network including a pre-embedding network and the parallel embedding network (i.e., the first common-emitter transistor, the first unilateral pre-embedding inductor, the parallel embedding inductor, and the first capacitor) is as follows:

$$Y_{tot} = \begin{bmatrix} Y_{tot11} & Y_{tot12} \\ Y_{tot21} & Y_{tot22} \end{bmatrix} = \qquad (1)$$

$$\frac{1}{\Delta Z_{pre}\Delta Y} \begin{bmatrix} Y_{11} + jX_c\Delta Y + jB_p\Delta Z_{pre}\Delta Y & Y_{12} - jB_p\Delta Z_{pre}\Delta Y \\ Y_{21} - jB_p\Delta Z_{pre}\Delta Y & Y_{22} + jB_p\Delta Z_{pre}\Delta Y \end{bmatrix}$$

where $\Delta Y = Y_{11}Y_{22} - Y_{12}Y_{21}$, $\Delta Z_{pre} = \dfrac{Y_{22}(Y_{11} + jX_c\Delta Y) - Y_{12}Y_{21}}{\Delta Y^2}$.

A transfer factor A of the total network is as follows:

$$A_{tot} = \frac{Y_{tot21}}{Y_{tot12}} \qquad (2)$$

A gain G of a new network (i.e., the total network) is as follows:

$$G = \frac{|A_{tot}|}{K + \sqrt{K^2 - 1}} \qquad (3)$$

where K represents a stability coefficient.

It can be seen that gains G of different networks are obtained by combining different unilateral pre-embedding inductors and parallel embedding inductors, and an influence diagram of the gains of the total network of the different networks is plotted, when the gains all take peak values, an inductance value of the parallel embedding inductor decreases with an increase of the unilateral pre-embedding inductor, which indicates that an introduction of the unilateral pre-embedding inductor reduces the parallel embedding inductor.

The disclosure has the following beneficial effects.

(1) The disclosure provides the common-emitter amplifier with the unilateral pre-embedding inductors, which improves the gain of a single-tube common-emitter amplifier when an operating frequency approaches a $f_{max}$ of the transistor by introducing a parallel embedding inductor into a traditional common-emitter amplifier.

(2) The disclosure provides the common-emitter amplifier with the unilateral pre-embedding inductors. By introducing the unilateral pre-embedding inductor into the collector, the difficulty of implementing the parallel embedding inductor at high frequencies is reduced; and through the staggered tuning of the interstage matching circuit, a bandwidth range of the multi-stage common emitter amplifier is expanded.

DETAILED DESCRIPTION OF EMBODIMENTS

In order to facilitate the understanding and implementation of the disclosure by those skilled in the art, a further detailed description of the disclosure is provided below in conjunction with the accompanying drawings and embodiments. Apparently, the described embodiments are only partial embodiments of the disclosure, not all embodiments. Based on the embodiments in the disclosure, all other embodiments obtained by those skilled in the art without creative labor should fall within the scope of protection of the disclosure.

The disclosure provides a common-emitter amplifier with unilateral pre-embedding inductors, which applies two independent technologies: a single-stage gain unit adopts a common-emitter structure with a unilateral pre-embedding inductor to improve an appropriate compensation gain, and a specific Y-parameter matrix calculation method is provided to assist amplifier design; and an interstage matching circuit uses staggered tuning to appropriately expand bandwidth. The common-emitter amplifier of the disclosure is implemented using a 0.13 micrometers (μm) silicon germanium (SiGe) bipolar complementary metal oxide semiconductor (BiCMOS) process, with a replicable design, and is capable of operating in a 260 gigahertz (GHz) to 300 GHz frequency band.

Figure 1:
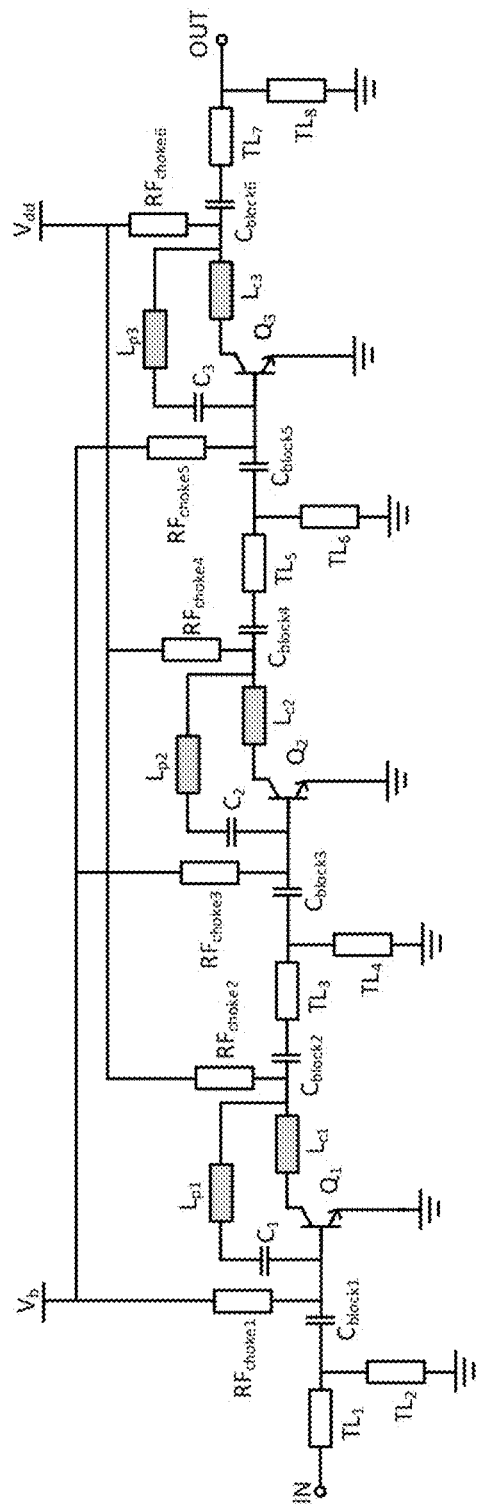
FIG. 1 illustrates a circuit diagram of a common-emitter amplifier with unilateral pre-embedding inductors of the disclosure.

The common-emitter amplifier with the unilateral pre-embedding inductors, as shown in FIG. 1, includes: an input matching circuit, a first-stage amplification circuit, a first-stage interstage matching circuit, a second-stage amplification circuit, a second-stage interstage matching circuit, a third-stage amplification circuit, a third-stage interstage matching circuit, and an output matching circuit.

An input end of the input matching circuit is a signal input end IN configured to receive signals, an output end of the input matching circuit is connected to an input end of the first-stage amplification circuit, and the input matching circuit is configured to output an RF signal to the first-stage amplification circuit for first-stage amplification to obtain a first-stage amplified RF signal.

The input end of the first-stage amplification circuit is connected to the output end of the input matching circuit, the first-stage interstage matching circuit is configured to transmit the first-stage amplified RF signal to an input end of the second-stage amplification circuit for two-stage amplification to obtain a two-stage amplified RF signal.

An output end of the second-stage amplification circuit is connected to an input end of the second-stage interstage matching circuit, and the second-stage interstage matching circuit is configured to output the two-stage amplified RF signal from the second-stage amplification circuit to an input end of the third-stage amplification circuit for three-stage amplification to obtain a three-stage amplified RF signal.

An output end of the third-stage amplification circuit is connected to an input end of the output matching circuit, and the output matching circuit is configured to output the three-stage amplified RF signal to a signal output end OUT of the common-emitter amplifier.

The input matching circuit includes a first transmission line $TL_1$, a second transmission line $TL_2$, and a first DC-blocking capacitor $C_{block1}$.

The first end of the first transmission line $TL_1$ is connected to the signal input end IN, the second end of the first transmission line $TL_1$ is connected to the first end of the second transmission line $TL_2$, the second end of the second transmission line $TL_2$ is grounded, the second end of the first transmission line $TL_1$ is connected to the first end of the first DC-blocking capacitor $C_{block1}$, and the second end of the first DC-blocking capacitor $C_{block1}$ is connected to the first-stage amplification circuit.

The first-stage amplification circuit includes: a first common-emitter transistor $Q_1$, a first unilateral pre-embedding inductor Lei, a first parallel embedding inductor $L_{p1}$, a first capacitor $C_1$, a first RF choke inductor $RF_{choke1}$, and a second RF choke inductor $RF_{choke2}$.

A base of the first common-emitter transistor $Q_1$ is connected to the second end of the first DC-blocking capacitor $C_{block1}$, the base of the first common-emitter transistor $Q_1$ is connected to the first end of the first RF choke inductor $RF_{choke1}$, the second end of the first RF choke inductor $RF_{choke1}$ is connected to a base bias voltage $V_b$, an emitter of the first common-emitter transistor $Q_1$ is grounded, the base of the first common-emitter transistor $Q_1$ is connected to the first end of the first capacitor $C_1$, the second end of the first capacitor $C_1$ is connected to the first end of the first parallel embedding inductor $L_{p1}$, a collector of the first common-emitter transistor $Q_1$ is connected to the first end of the first unilateral pre-embedding inductor Lei, the second end of the first parallel embedding inductor $L_{p1}$ is connected to the second end of the first unilateral pre-embedding inductor Lei, the second end of the first unilateral pre-embedding inductor Lei is connected to the first end of the second RF choke inductor $RF_{choke2}$, and the second end of the second RF choke inductor $RF_{choke2}$ is connected to a power supply voltage $V_{dd}$.

The first-stage interstage matching circuit includes: a third transmission line $TL_3$, a fourth transmission line $TL_4$, a second DC-blocking capacitor $C_{block2}$, and a third DC-blocking capacitor $C_{block3}$.

The first end of the second DC-blocking capacitor $C_{block2}$ is connected to the second end of the first unilateral pre-embedding inductor Lei, the second end of the second DC-blocking capacitor $C_{block2}$ is connected to the first end of the third transmission line $TL_3$, the second end of the third transmission line $TL_3$ is connected to the first end of the fourth transmission line $TL_4$, the second end of the fourth transmission line $TL_4$ is grounded, and the second end of the third transmission line $TL_3$ is connected to the first end of the third DC-blocking capacitor $C_{block3}$.

The second-stage amplification circuit includes: a second common-emitter transistor $Q_2$, a second unilateral pre-embedding inductor $L_{c2}$, a second parallel embedding inductor $L_{p2}$, a second capacitor $C_2$, a third RF choke inductor $RF_{choke3}$, and a fourth RF choke inductor $RF_{choke4}$.

A base of the second common-emitter transistor $Q_2$ is connected to the second end of the third DC-blocking capacitor $C_{block3}$, the base of the second common-emitter transistor $Q_2$ is connected to the first end of the third RF choke inductor $RF_{choke3}$, the second end of the third RF choke inductor $RF_{choke3}$ is connected to the base bias voltage $V_b$, an emitter of the second common-emitter transistor $Q_2$ is grounded, the base of the second common-emitter transistor $Q_2$ is connected to the first end of the second capacitor $C_2$, the second end of the second capacitor $C_2$ is connected to the first end of the second parallel embedding inductor $L_{p2}$, a collector of the second common-emitter transistor $Q_2$ is connected to the first end of the second unilateral pre-embedding inductor $L_{c2}$, the second end of the second parallel embedding inductor $L_{p2}$ is connected to the second end of the second unilateral pre-embedding inductor $L_{c2}$, the second end of the second unilateral pre-embedding inductor $L_{c2}$ is connected to the first end of the fourth RF choke inductor $RF_{choke4}$, and the second end of the fourth RF choke inductor $RF_{choke4}$ is connected to the power supply voltage $V_{dd}$.

The second-stage interstage matching circuit includes: a fifth transmission line $TL_5$, a sixth transmission line $TL_6$, a fourth DC-blocking capacitor $C_{block4}$, and a fifth DC-blocking capacitor $C_{block5}$.

The first end of the fourth DC-blocking capacitor $C_{block4}$ is connected to the second end of the second unilateral pre-embedding inductor $L_{c2}$, the second end of the fourth DC-blocking capacitor $C_{block4}$ is connected to the first end of the fifth transmission line $TL_5$, the second end of the fifth transmission line $TL_5$ is connected to the first end of the sixth transmission line $TL_6$, the second end of the sixth transmission line $TL_6$ is grounded, and the second end of the fifth transmission line $TL_5$ is connected to the first end of the fifth DC-blocking capacitor $C_{block5}$.

The first-stage interstage matching circuit and the second-stage interstage matching circuit are set at different frequency points, with the staggered tuning used to expand the bandwidth.

The third-stage amplification circuit includes: a third common-emitter transistor $Q_3$, a third unilateral pre-embedding inductor $L_{c3}$, a third parallel embedding inductor $L_{p3}$, a third capacitor $C_3$, a fifth RF choke inductor $RF_{choke5}$, and a sixth RF choke inductor $RF_{choke6}$.

A base of the third common-emitter transistor $Q_3$ is connected to the second end of the fifth DC-blocking capacitor $C_{block5}$, the base of the third common-emitter transistor $Q_3$ is connected to the first end of the fifth RF choke inductor $RF_{choke5}$, the second end of the fifth RF choke inductor $RF_{choke5}$ is connected to the base bias voltage $V_b$, an emitter of the third common-emitter transistor $Q_3$ is grounded, the base of the third common-emitter transistor $Q_3$ is connected to the first end of the third capacitor $C_3$, the second end of the third capacitor $C_3$ is connected to the first end of the third parallel embedding inductor $L_{p3}$, a collector of the third common-emitter transistor $Q_3$ is connected to the first end of the third unilateral pre-embedding inductor $L_{c3}$, the second end of the third parallel embedding inductor $L_{p3}$ is connected to the second end of the third unilateral pre-embedding inductor $L_{c3}$, the second end of the third unilateral pre-embedding inductor $L_{c3}$ is connected to the first end of the sixth RF choke inductor $RF_{choke6}$, and the second end of the sixth RF choke inductor $RF_{choke6}$ is connected to the power supply voltage $V_{dd}$.

The output matching circuit includes: a seventh transmission line $TL_7$, an eighth transmission line $TL_8$, and a sixth DC-blocking capacitor $C_{block6}$.

The first end of the sixth DC-blocking capacitor $C_{block6}$ is connected to the second end of the third unilateral pre-embedding inductor $L_{c3}$, the second end of the sixth DC-blocking capacitor $C_{block6}$ is connected to the first end of the seventh transmission line $TL_7$, the second end of the seventh transmission line $TL_7$ is connected to the first end of the eighth transmission line $TL_8$, the second end of the eighth transmission line $TL_8$ is grounded, and the second end of the seventh transmission line $TL_7$ is connected to the signal output end OUT of the common-emitter amplifier.

Furthermore, the first common-emitter transistor $Q_1$, the second common-emitter transistor $Q_2$, and the third common-emitter transistor $Q_3$ use heterojunction bipolar transistors (HBTs).

A working principle of the common-emitter amplifier with a single-sided pre-embedding inductor is as follows:

1. The common-emitter amplifier is configured to: make an input signal sequentially enter the bases of the common-emitter transistors of the first-stage, second-stage, and third-stage amplification circuits, make the input signal be amplified stage by stage by the common-emitter transistors, and finally make the amplified input signal obtained by amplifying of each common-emitter transistor output through the collector of each of the common-emitter transistors, as an output signal of each common-emitter transistor; and the common-emitter amplifier is further configured to introduce interstage staggered tuning to expand bandwidth to address a narrowband problem caused by the resonance of inductance and capacitance.

2. A miller capacitor between the base and the collector of each common-emitter transistor causes direct coupling between originally isolated input and output signals of each common-emitter transistor; and an amplitude of the output signal of the collector of each common-emitter transistor is closely related to a value of the miller capacitor.

Figure 2:
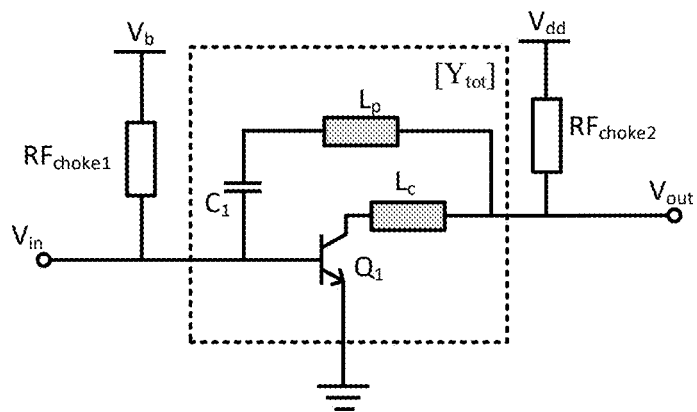
FIG. 2 illustrates a circuit diagram of a single-stage common-emitter amplifier with a unilateral pre-embedding inductor of the disclosure.

As shown in FIG. 2, a gain enhancement process based on the unilateral pre-embedding inductor is as follows.

The single-stage gain unit includes a common-emitter transistor $Q_1$, a unilateral pre-embedding inductor $L_c$ at a collector, a parallel embedding network composed of a parallel embedding inductor $L_p$ and a capacitor $C_1$, an RF choke inductor $RF_{choke1}$, and another RF choke inductor $RF_{choke2}$. At the same time, by introducing the parallel embedding inductor $L_p$ between the base and the collector of each common emitter transistor, the parallel embedding inductor $L_p$ is configured to resonate with the miller capacitor $C_\mu$ within a certain range, thereby eliminating an influence of the miller capacitor $C_\mu$, increasing the amplitude of the output signal of the collector of each common-emitter transistor, i.e., improving the gain of each common-emitter transistor. By selecting an appropriate $L_p$, the gain $G_{ma}$ can be increased to approach the maximum achievable gain $G_{max}$ at a specific working frequency.

In this embodiment, the common-emitter transistors of the common-emitter amplifier adopt the HBT, and the miller capacitor C is a parasitic capacitor between the base (B) and the collector (C), also known as a collector junction capacitor. For an amplifier circuit connected by common-emitter configuration, each common-emitter transistor amplifies an input signal at the base and then generates an output signal at the collector.

The miller capacitor C builds a bridge between the input and output signals of the common-emitter transistor, thereby creating direct coupling between the originally isolated input and output signals. Therefore, the amplitude of the output signal of the collector of the common-emitter transistor is closely related to a value of the miller capacitor $C_\mu$.

3. The common-emitter amplifier further includes the unilateral pre-embedding inductors, and each unilateral pre-embedding inductor is configured to reduce a required value of the parallel embedding inductor between the base and the collector of a corresponding common-emitter transistor, thereby to reduce the difficulty of implementing the parallel embedding inductor between the base and the collector of the corresponding common-emitter transistor at high frequencies.

A specific process is as follows.

Firstly, an admittance matrix of the common-emitter transistor $Q_1$ of the common-emitter transistors is expressed as $[Y_{11}\ Y_{12};\ Y_{21}\ Y_{22}]$, an impedance of the unilateral pre-embedding inductor $L_c$ is expressed as $jX_c$, an admittance value of a parallel embedding network including the parallel embedding inductor $L_p$ and the first capacitor $C_1$ is expressed as $jB_p$, and an admittance matrix $Y_{tot}$ of a total network including a pre-embedding network and the parallel embedding network is as follows:

$$Y_{tot} = \begin{bmatrix} Y_{tot11} & Y_{tot12} \\ Y_{tot21} & Y_{tot22} \end{bmatrix} = \tag{1}$$

$$\frac{1}{\Delta Z_{pre}\Delta Y}\begin{bmatrix} Y_{11} + jX_c\Delta Y + jB_p\Delta Z_{pre}\Delta Y & Y_{12} - jB_p\Delta Z_{pre}\Delta Y \\ Y_{21} - jB_p\Delta Z_{pre}\Delta Y & Y_{22} + jB_p\Delta Z_{pre}\Delta Y \end{bmatrix}$$

where $\Delta Y = Y_{11}Y_{22} - Y_{12}Y_{21}$, $\Delta Z_{pre} = \frac{Y_{22}(Y_{11} + jX_c\Delta Y) - Y_{12}Y_{21}}{\Delta Y^2}$.

A transfer factor A of the total network is as follows:

$$A_{tot} = \frac{Y_{tot21}}{Y_{tot12}} \tag{2}$$

A gain G of the total network is as follows:

$$G = \frac{|A_{tot}|}{K + \sqrt{K^2 - 1}} \tag{3}$$

where K represents a stability coefficient.

It can be seen that gains G of different networks are obtained by combining different unilateral pre-embedding inductors $L_c$ and parallel embedding inductors $L_p$, and an influence diagram of the gains of the total network of the different networks is plotted, when the gains all take peak values, an inductance value of the parallel embedding inductor $L_p$ decreases with an increase of the unilateral pre-embedding inductor $L_c$, which indicates that an introduction of the unilateral pre-embedding inductor $L_c$ reduces the parallel embedding inductor $L_p$.

As can be seen from equations (1) to (3), the transfer factor and the stability coefficient can be obtained from the admittance matrix $Y_{tot}$ of the total network, and then the gain G of the new network (i.e., the total network) can be obtained. The gains G of the different networks are obtained by combining different unilateral pre-embedding inductors $L_c$ and parallel embedding inductors $L_p$, which are used to assist in the design of the amplifier gain unit.

According to a non-patent literature "A high-gain mm-wave amplifier design: An analytical approach to power gain boosting." (Bameri H, Momeni O, IEEE Journal of Solid-State Circuits, 2017, 52(2): 357-370), if only parallel embedding inductors are added, a transformation factor $A_p$ of the new network is as follows:

$$A_p = \frac{Y_{21} - jB_p}{Y_{12} - jB_p}$$

In this embodiment, a transformation factor $A_{tot}$ of the new network with the unilateral pre-embedding inductors and the parallel embedding inductors is as follows:

$$A_{tot} = \frac{Y_{tot12}}{Y_{tot12}} = \frac{Y_{21} - jB_p \Delta Z_{pre} \Delta Y}{Y_{12} - jB_p \Delta Z_{pre} \Delta Y} = \frac{Y_{21} - jB_p(1 + jX_c Y_{22} \Delta Y)}{Y_{12} - jB_p(1 + jX_c Y_{22} \Delta Y)}$$

Comparing $A_p$ and $A_{tot}$, after introducing the unilateral pre-embedding inductors, $-jB_p$ becomes $-jB_p(1+jX_cY_{22}\Delta Y)$, where $B_p$ represents a susceptance value of the parallel embedding inductor $L_p$, and $X_c$ represents a reactance value of the unilateral pre-embedding inductor $L_c$, which is equivalent to multiplying the susceptance term of the parallel embedding inductor by a coefficient $(1+jX_cY_{22}\Delta Y)$. By introducing the unilateral pre-embedding inductor, it is possible to reduce the inductance value of the parallel embedding inductor when achieving the same gain, thereby reducing the difficulty of implementing the parallel embedding inductor.

Figure 3:
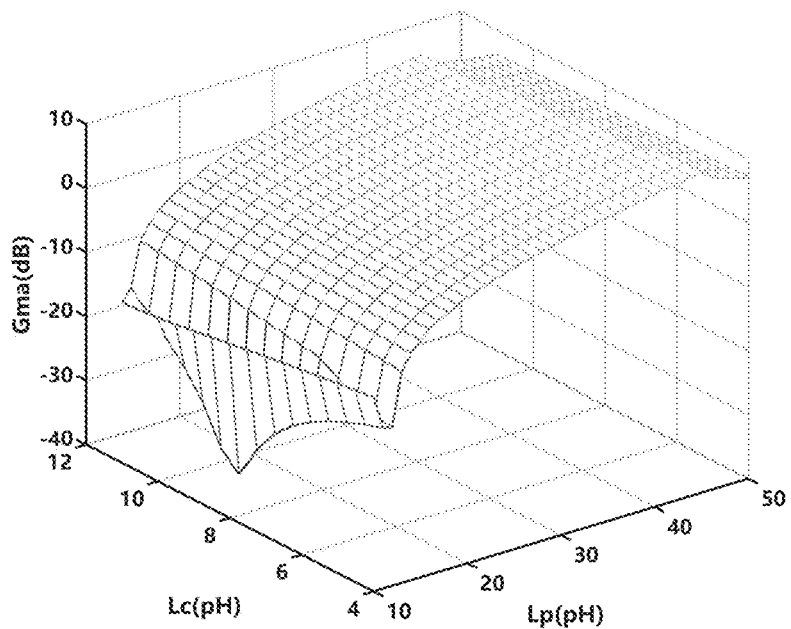
FIG. 3 illustrates a curve graph showing variations of a maximum available gain $G_{ma}$ of the common-emitter amplifier with the unilateral pre-embedding inductors as a function of a unilateral pre-embedding inductor $L_c$ and a parallel embedding inductor $L_p$ of the disclosure.

FIG. 3 illustrates a theoretical curve graph showing the influence of the unilateral pre-embedding inductor $L_c$ and the parallel embedding inductor $L_p$ on a gain of a total network of a single-stage gain unit at 273 GHz. Considering a subsequent transmission line implementation, the inductance value of the unilateral pre-embedding inductor $L_c$ is set in a range of 4 picohenry (pH) to 11 pH, and the inductance value of the parallel embedding inductor $L_p$ is in a range of 10 pH to 50 pH. It can be seen that when the gains are all at peak points, the inductance value of the parallel embedding inductor $L_p$ decreases with the increase of the unilateral pre-embedding inductor $L_c$. The introduction of the unilateral pre-embedding inductor $L_c$ can reduce the parallel embedding inductor $L_p$ to a certain extent, which is helpful for the implementation of the parallel embedding inductor $L_p$.

Figure 4:
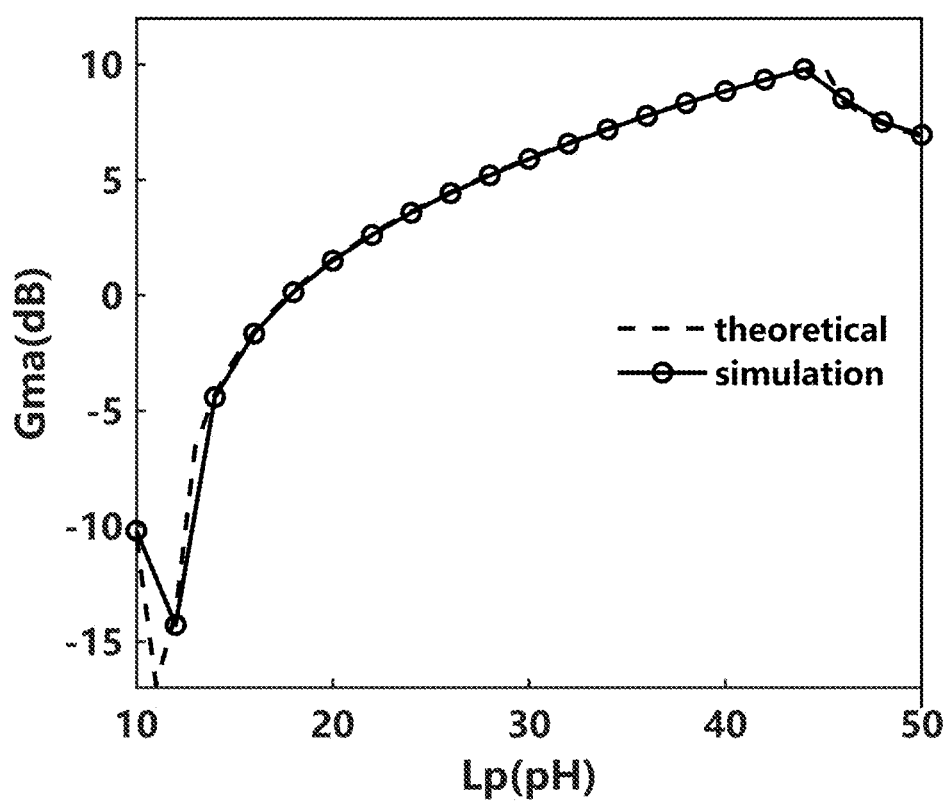
FIG. 4 illustrates a theoretical and simulated curve graph showing variations of the maximum available gain $G_{ma}$ of the common-emitter amplifier with the unilateral pre-embedding inductors as a function of the parallel embedding inductor $L_p$ of the disclosure.

FIG. 4 shows a theoretical and simulated curve graph of variations of the maximum available gain $G_{ma}$ of the total network of the single-stage gain unit as a function of the parallel embedding inductor $L_p$, when the unilateral pre-embedding inductor $L_c$ is 4 pH. As can be seen from the FIG. 4, theoretical results show that when the inductance value of the unilateral pre-embedding inductor $L_c$ is 4 pH and the inductance value of the parallel embedding inductor $L_p$ is 43 pH, the maximum available gain $G_{ma}$ reaches a maximum value of 9.4 decibel (dB). Simulation results show that when the inductance value of the unilateral pre-embedding inductor $L_c$ is 4 pH and the inductance value of the parallel embedding inductor $L_p$ is 45 pH, the maximum available gain $G_{ma}$ reaches a maximum value of 10 dB. When the parallel embedding inductor $L_p$ is in a range of 14 pH to 42 pH, the theoretical curve fits very well with the simulation results. When the parallel embedding inductor $L_p$ is greater than 42 pH, there is an error of about 1 dB. When the parallel embedding inductor $L_p$ is in a range of 10 pH to 50 pH, an overall trend of the theoretical curve is consistent with that of the simulation curve, indicating that the formula (1) can effectively assist amplifier design.

Figure 5:
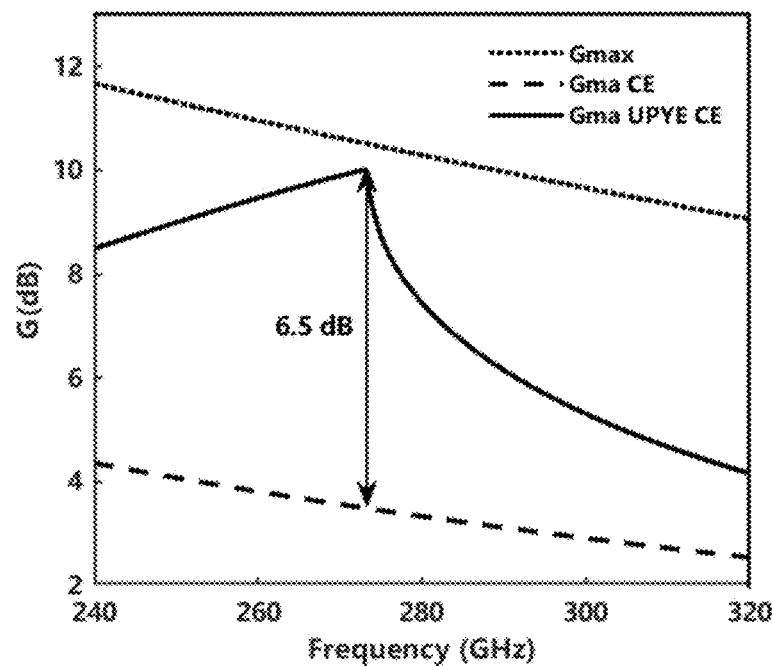
FIG. 5 illustrates a simulated curve graph of maximum available gains $G_{ma}$ of a common-emitter amplifier in the related art and the common-emitter amplifier with the unilateral pre-embedding inductors of the disclosure.

FIG. 5 shows maximum available gain results of a single-stage common-emitter amplifier (CE) in the related art and the single-stage common-emitter amplifier with the unilateral pre-embedding $L_c$ (unilateral pre-embedding and Y-embedding common emitter, UPYE CE). As can be seen from FIG. 5, at 273 GHz, the theoretical maximum achievable gain $G_{max}$ is 10.5 dB. After adding the unilateral pre-embedding inductor $L_c$, the maximum available gain $G_m$a of the single-stage common-emitter amplifier has increased from 3.5 dB to 10 dB. The gain of the single-stage common-emitter amplifier has increased by about 6.5 dB, approaching the maximum achievable gain $G_m$. This indicates that by introducing the unilateral pre-embedding inductor $L_c$, the gain performance of the common-emitter amplifier can be effectively improved.

Figure 6:
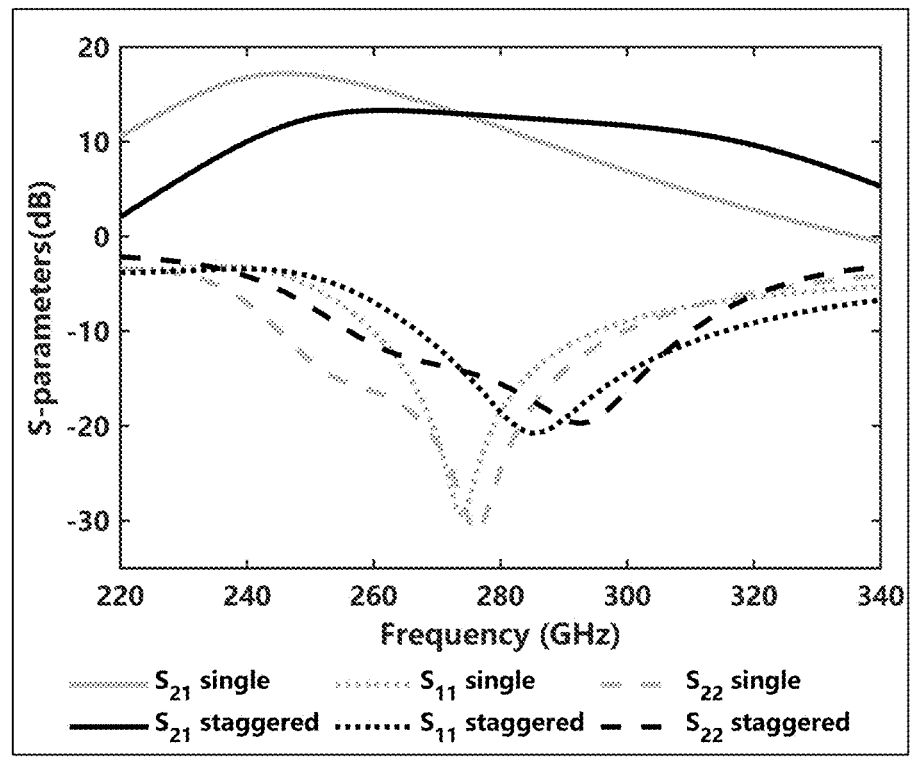
FIG. 6 illustrates an S-parameter curve graph of the common-emitter amplifier with the unilateral pre-embedding inductors, with matching at a single frequency point, and staggered tuning used for the disclosure.

FIG. 6 shows a S-parameter curve graph of the common-emitter amplifier with the unilateral pre-embedding inductors at a single frequency point matching and using staggered tuning, respectively. A $S_{21}$ staggered curve represents the gain performance using the staggered tuning, a $S_{11}$ staggered curve represents the input impedance matching performance using the staggered tuning, and a $S_{22}$ staggered curve represents the output impedance matching performance using the staggered tuning. A $S_{21}$ single-frequency point curve represents the gain performance matched at a single frequency point, a $S_{11}$ single-frequency point curve represents the input impedance matching performance matched at a single frequency point, and the $S_{22}$ single-frequency point curve represents the output impedance matching performance matched at a single frequency point. From FIG. 6, it can be seen that both the single-frequency point matching and the staggered tuning have good input and output matching performance in a range of 260 GHz to 300 GHz; the single-frequency point matching has the maximum gain of 17.2 dB at about 246 GHz, and the bandwidth at 3 dB is about 37 GHz; the staggered tuning has the maximum gain of 13.3 dB at 262 GHz, and the bandwidth at 3 dB is about 74 GHz. By introducing the staggered tuning, the problem of bandwidth reduction caused by the parallel embedded inductor can be improved.

What is claimed is:

1. A common-emitter amplifier with unilateral pre-embedding inductors, the common-emitter amplifier comprising:
   an input matching circuit, a first-stage amplification circuit, a first-stage interstage matching circuit, a second-stage amplification circuit, a second-stage interstage matching circuit, a third-stage amplification circuit, a third-stage interstage matching circuit, and an output matching circuit;
   wherein the common-emitter amplifier is configured to: make an input signal sequentially enter bases of common-emitter transistors of the first-stage, second-stage, and third-stage amplification circuits, make the input signal be amplified stage by stage by the common-emitter transistors, and finally make an amplified input signal obtained by amplifying of each of the common-emitter transistors output through a collector of each of the common-emitter transistors, as an output signal of each of the common-emitter transistors; and the common-emitter amplifier is further configured to introduce interstage staggered tuning to expand bandwidth to address a narrowband problem caused by resonance of inductance and capacitance;
   wherein a miller capacitor ($C_\mu$) between the base and the collector of each of the common-emitter transistors causes direct coupling between originally isolated input and output signals of each of the common-emitter transistors; and an amplitude of the output signal of the collector of each of the common-emitter transistors is closely related to a value of the miller capacitor ($C_\mu$);
   wherein a parallel embedding inductor ($L_p$) is introduced between the base and the collector of each of the common-emitter transistors, and is configured to resonate with the miller capacitor ($C_\mu$) between the base and the collector of each of the common-emitter transistors thereby to eliminate an influence of the miller capacitor, improve the amplitude of the output signal of the collector of each of the common-emitter transistors, and increase a gain $G_{ma}$ of each of the common-emitter transistors to a maximum achievable gain $G_{max}$ at an operating frequency;

wherein the common-emitter amplifier further comprises the unilateral pre-embedding inductors, and each of the unilateral pre-embedding inductors is configured to reduce a required value of the parallel embedding inductor ($L_p$) between the base and collector of a corresponding one of the common-emitter transistors, thereby to reduce difficulty of implementing the parallel embedding inductor ($L_p$) between the base and the collector of the corresponding one of the common-emitter transistors;

wherein an admittance matrix of a first common-emitter transistor ($Q_1$) of the common-emitter transistors is expressed as $[Y_{11}\ Y_{12}; Y_{21}\ Y_{22}]$, an impedance of a first unilateral pre-embedding inductor ($L_c$) of the unilateral pre-embedding inductors is expressed as $jX_c$, an admittance value of a parallel embedding network comprising the parallel embedding inductor ($L_p$) and a first capacitor ($C_1$) is expressed as $jB_p$, and an admittance matrix ($Y_{tot}$) of a total network comprising the first common-emitter transistor ($Q_1$), the first unilateral pre-embedding inductor ($L_c$), the parallel embedding inductor ($L_p$) and the first capacitor ($C_1$) is as follows:

$$T_{tot} = \begin{bmatrix} Y_{tot11} & Y_{tot12} \\ Y_{tot21} & T_{tot22} \end{bmatrix} \quad (1)$$

$$= \frac{1}{\Delta Z_{pre} \Delta Y} \begin{bmatrix} Y_{11} + jX_c\Delta Y + jB_p\Delta Z_{pre}\Delta Y & Y_{12} - jB_p\Delta Z_{pre}\Delta Y \\ Y_{21} - jB_p\Delta Z_{pre}\Delta Y & Y_{22} + jB_p\Delta Z_{pre}\Delta Y \end{bmatrix}$$

where $$\Delta Y = Y_{11}Y_{22} - Y_{12}Y_{21}, \Delta Z_{pre} = \frac{Y_{22}(Y_{11} + jX_c\Delta Y) - Y_{12}Y_{21}}{\Delta Y^2};$$

wherein a transfer factor A of the total network is as follows:

$$A_{tot} = \frac{Y_{tot21}}{Y_{tot12}} \quad (2)$$

and a gain G of the total network is as follows:

$$G = \frac{|A_{tot}|}{K + \sqrt{K^2 - 1}} \quad (3)$$

where K represents a stability coefficient;

wherein gains G of different networks are obtained by combining different unilateral pre-embedding inductors ($L_c$) and parallel embedding inductors ($L_p$), and an influence diagram of the gains of the total network of the different networks is plotted, when the gains all take peak values, an inductance value of the parallel embedding inductor ($L_p$) decreases with an increase of the unilateral pre-embedding inductor ($L_c$), which indicates that an introduction of the unilateral pre-embedding inductor ($L_c$) reduces the parallel embedding inductor ($L_p$).

2. The common-emitter amplifier with the unilateral pre-embedding inductors as claimed in claim 1, wherein an input end of the input matching circuit is an input end (IN) configured to receive signals, an output end of the input matching circuit is connected to an input end of the first-stage amplification circuit, and the input matching circuit is configured to output a radio frequency (RF) signal to the first-stage amplification circuit for first-stage amplification to thereby obtain a first-stage amplified RF signal;

wherein the first-stage interstage matching circuit is configured to transmit the first-stage amplified RF signal to the second-stage amplification circuit for two-stage amplification to thereby obtain a two-stage amplified RF signal, an output end of the second-stage amplification circuit is connected to the second-stage interstage matching circuit, and the second-stage interstage matching circuit is configured to output the two-stage amplified RF signal from the second-stage amplification circuit to the third-stage amplification circuit for three-stage amplification to thereby obtain a three-stage amplified RF signal; and an output end of the third-stage amplification circuit is connected to the output matching circuit, and the output matching circuit is configured to output the three-stage amplified RF signal to an output end (OUT) of the common-emitter amplifier.

3. The common-emitter amplifier with the unilateral pre-embedding inductors as claimed in claim 1, wherein the input matching circuit comprises a first transmission line ($TL_1$), a second transmission line ($TL_2$), and a first direct current (DC)-blocking capacitor ($C_{block1}$);

wherein a first end of the first transmission line ($TL_1$) is connected to the input end (IN), a second end of the first transmission line ($TL_1$) is connected to a first end of the second transmission line ($TL_2$) and a first end of the first DC-blocking capacitor ($C_{block1}$) individually, a second end of the second transmission line ($TL_2$) is grounded, and a second end of the first DC-blocking capacitor ($C_{block1}$) is connected to the first-stage amplification circuit;

wherein the first-stage amplification circuit comprises: the first common-emitter transistor ($Q_1$), a first unilateral pre-embedding inductor ($L_{c1}$), a first parallel embedding inductor ($L_{p1}$), the first capacitor ($C_1$), a first RF choke inductor ($RF_{choke1}$), and a second RF choke inductor ($RF_{choke2}$);

wherein the base of the first common-emitter transistor ($Q_1$) is connected to the second end of the first DC-blocking capacitor ($C_{block1}$), a first end of the first RF choke inductor ($RF_{choke1}$) and a first end of the first capacitor ($C_1$) individually, an emitter of the first common-emitter transistor ($Q_1$) is grounded, and the collector of the first common-emitter transistor ($Q_1$) is connected to a first end of the first unilateral pre-embedding inductor (Lei);

wherein a second end of the first RF choke inductor ($RF_{choke1}$) is connected to a base bias voltage ($V_b$), a second end of the first capacitor ($C_1$) is connected to a first end of the first parallel embedding inductor ($L_{p1}$), a second end of the first parallel embedding inductor ($L_{p1}$) is connected to a second end of the first unilateral pre-embedding inductor ($L_{c1}$), the second end of the first unilateral pre-embedding inductor ($L_{c1}$) is connected to a first end of the second RF choke inductor ($RF_{choke2}$), and a second end of the second RF choke inductor ($RF_{choke2}$) is connected to a power supply voltage ($V_{dd}$);

wherein the first-stage interstage matching circuit comprises: a third transmission line ($TL_3$), a fourth transmission line ($TL_4$), a second DC-blocking capacitor ($C_{block2}$), and a third DC-blocking capacitor ($C_{block3}$);

wherein a first end of the second DC-blocking capacitor ($C_{block2}$) is connected to the second end of the first unilateral pre-embedding inductor ($L_{c1}$), a second end of the second DC-blocking capacitor ($C_{block2}$) is connected to a first end of the third transmission line ($TL_3$), a second end of the third transmission line ($TL_3$) is connected to a first end of the fourth transmission line ($TL_4$), a second end of the fourth transmission line ($TL_4$) is grounded, and the second end of the third transmission line ($TL_3$) is connected to a first end of the third DC-blocking capacitor ($C_{block3}$);

wherein the second-stage amplification circuit comprises: a second common-emitter transistor ($Q_2$), a second unilateral pre-embedding inductor ($L_{c2}$), a second parallel embedding inductor ($L_{p2}$), a second capacitor ($C_2$), a third RF choke inductor ($RF_{choke3}$), and a fourth RF choke inductor ($RF_{choke4}$);

wherein the base of the second common-emitter transistor ($Q_2$) is connected to a second end of the third DC-blocking capacitor ($C_{block3}$), a first end of the third RF choke inductor ($RF_{choke3}$), and a first end of the second capacitor ($C_2$) individually, an emitter of the second common-emitter transistor ($Q_2$) is grounded, and the collector of the second common-emitter transistor ($Q_2$) is connected to a first end of the second unilateral pre-embedding inductor ($L_{c2}$);

wherein a second end of the third RF choke inductor ($RF_{choke3}$) is connected to the base bias voltage ($V_b$), a second end of the second capacitor ($C_2$) is connected to a first end of the second parallel embedding inductor ($L_{p2}$), a second end of the second parallel embedding inductor ($L_{p2}$) is connected to a second end of the second unilateral pre-embedding inductor ($L_{c2}$), the second end of the second unilateral pre-embedding inductor ($L_{c2}$) is connected to a first end of the fourth RF choke inductor ($RF_{choke4}$), and a second end of the fourth RF choke inductor ($RF_{choke4}$) is connected to the power supply voltage ($V_{dd}$);

wherein the second-stage interstage matching circuit comprises: a fifth transmission line ($TL_5$), a sixth transmission line ($TL_6$), a fourth DC-blocking capacitor ($C_{block4}$), and a fifth DC-blocking capacitor ($C_{block5}$);

wherein a first end of the fourth DC-blocking capacitor ($C_{block4}$) is connected to the second end of the second unilateral pre-embedding inductor ($L_{c2}$), a second end of the fourth DC-blocking capacitor ($C_{block4}$) is connected to a first end of the fifth transmission line ($TL_5$), a second end of the fifth transmission line ($TL_5$) is connected to a first end of the sixth transmission line ($TL_6$), a second end of the sixth transmission line ($TL_6$) is grounded, and the second end of the fifth transmission line ($TL_5$) is connected to a first end of the fifth DC-blocking capacitor ($C_{block5}$);

wherein the third-stage amplification circuit comprises: a third common-emitter transistor ($Q_3$), a third unilateral pre-embedding inductor ($L_{c3}$), a third parallel embedding inductor ($L_{p3}$), a third capacitor ($C_3$), a fifth RF choke inductor ($RF_{choke5}$), and a sixth RF choke inductor ($RF_{choke6}$);

wherein the base of the third common-emitter transistor ($Q_3$) is connected to a second end of the fifth DC-blocking capacitor ($C_{block5}$), a first end of the fifth RF choke inductor ($RF_{choke5}$), and a first end of the third capacitor ($C_3$) individually, an emitter of the third common-emitter transistor ($Q_3$) is grounded, and the collector of the third common-emitter transistor ($Q_3$) is connected to a first end of the third unilateral pre-embedding inductor ($L_{c3}$);

wherein a second end of the fifth RF choke inductor ($RF_{choke5}$) is connected to the base bias voltage ($V_b$), a second end of the third capacitor ($C_3$) is connected to a first end of the third parallel embedding inductor ($L_{p3}$), a second end of the third parallel embedding inductor ($L_{p3}$) is connected to a second end of the third unilateral pre-embedding inductor ($L_{c3}$), the second end of the third unilateral pre-embedding inductor ($L_{c3}$) is connected to a first end of the sixth RF choke inductor ($RF_{choke6}$), and a second end of the sixth RF choke inductor ($RF_{choke6}$) is connected to the power supply voltage ($V_{dd}$);

wherein the output matching circuit comprises: a seventh transmission line ($TL_7$), an eighth transmission line ($TL_8$), and a sixth DC-blocking capacitor ($C_{block6}$);

wherein a first end of the sixth DC-blocking capacitor ($C_{block6}$) is connected to the second end of the third unilateral pre-embedding inductor ($L_{c3}$), a second end of the sixth DC-blocking capacitor ($C_{block6}$) is connected to a first end of the seventh transmission line ($TL_7$), a second end of the seventh transmission line ($TL_7$) is connected to a first end of the eighth transmission line ($TL_8$), a second end of the eighth transmission line ($TL_8$) is grounded, and the second end of the seventh transmission line ($TL_7$) is connected to the output end (OUT) of the common-emitter amplifier.

\* \* \* \* \*